United States Patent [19]
Van Berkel et al.

[11] Patent Number: 5,590,275
[45] Date of Patent: Dec. 31, 1996

[54] METHOD FOR TESTING AN INTEGRATED CIRCUITRY AND AN INTEGRATED CIRCUIT HAVING A PLURALITY OF FUNCTIONAL COMPONENTS AND HAVING JUNCTION/SWITCH TEST COMPONENTS IN INTERCONNECTING CHANNELS BETWEEN FUNCTIONAL COMPONENTS

[75] Inventors: Cornelis H. Van Berkel; Maria E. Roncken; Ronald W. J. J. Saeijs, all of Eindhoven, Netherlands

[73] Assignee: U.S. Philips Corporation, New York, N.Y.

[21] Appl. No.: 389,083

[22] Filed: Feb. 14, 1995

Related U.S. Application Data

[63] Continuation of Ser. No. 16,409, Feb. 11, 1993, abandoned.

[30] Foreign Application Priority Data

Feb. 18, 1992 [EP] European Pat. Off. ............ 92200455

[51] Int. Cl.$^6$ ...................................................... G06F 11/34
[52] U.S. Cl. ...................... 395/183.06; 371/22.1
[58] Field of Search .................. 371/20.1, 21.1, 371/22.1, 22.3, 22.6, 22.5, 22.2; 395/183.02, 183.03, 183.06, 183.01

[56] References Cited

U.S. PATENT DOCUMENTS

| | | | |
|---|---|---|---|
| 4,494,066 | 1/1985 | Goel et al. . | |
| 4,656,592 | 4/1987 | Spaanenburg et al. | 364/200 |
| 5,005,136 | 4/1991 | Van Berket et al. | 364/200 |
| 5,008,618 | 4/1991 | Van Der Star | 371/22.3 |
| 5,043,986 | 8/1991 | Agrawal et al. | 371/25.1 |
| 5,079,696 | 1/1992 | Priem et al. | 395/500 |
| 5,119,480 | 6/1992 | Garcia, Jr. et al. | 395/325 |
| 5,132,974 | 7/1992 | Rosales | 371/22.3 |
| 5,150,044 | 9/1992 | Hashizume et al. | 371/22.3 |
| 5,166,604 | 11/1992 | Ahanin et al. | 371/22.3 |
| 5,325,367 | 6/1994 | Dekker et al. | 371/21.1 |

FOREIGN PATENT DOCUMENTS 9000544 3/1990 Netherlands .

OTHER PUBLICATIONS

Van Berkel et al. "The VLSI-Programming Language Tangram and its translation into handsake circuits" 1991 IEEE pp. 384–389.

Van Berkel "VLSI Programming and Silicon Compilation; A Novel Approach from Philips Research" 1988 IEEE pp. 150–151.

IEEE Standard 1149.1–1190 "Standard Test Access Port and Boundary Scan Architecture".

*Primary Examiner*—Robert W. Beausoliel, Jr.
*Assistant Examiner*—Albert DeCady
*Attorney, Agent, or Firm*—Laurie E. Gathman

[57] ABSTRACT

The invention proposes a testing method and associated arrangement for electronic circuitry that combines functional components that are interconnected by handshake channels. Various of such channels are now provided with an inbreaking junction and an outbreaking switch as a test component pair. The junction has two passive ports and one active port. The switch has one passive port and two active ports that are selected through a passive control port. In this way inbreaking into and outbreaking from the channel is rendered feasible. Now inbreaking is done on a first channel, and outbreaking on a second channel, so that thereby all components are tested that lie between the first channel's junction and the second channel's switch.

31 Claims, 9 Drawing Sheets

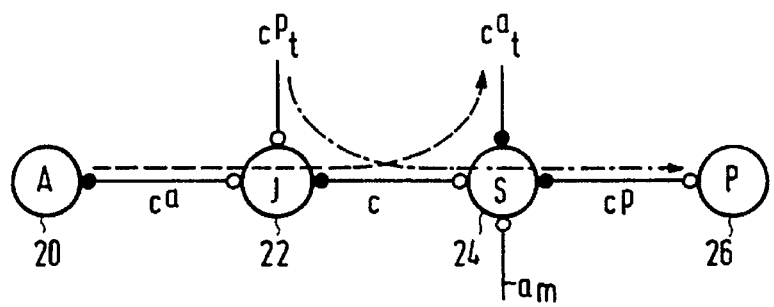
FIG. 4
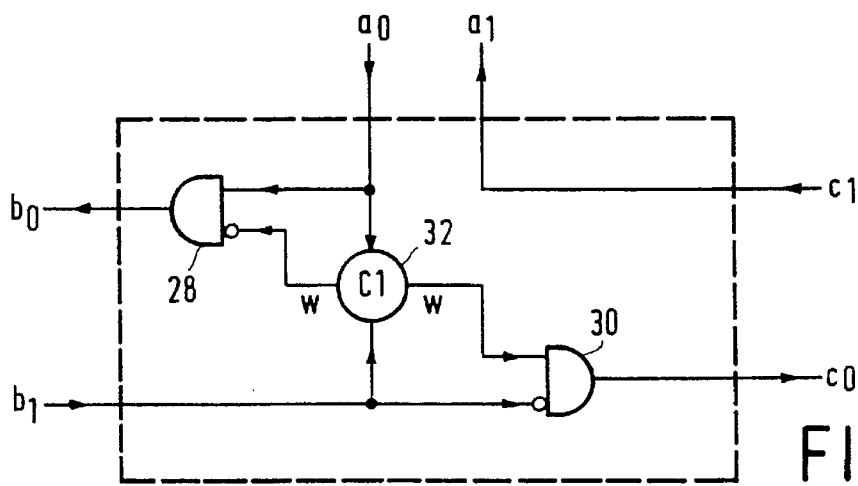
FIG. 5
| | a0 | b1 | c1 | (w) | a1 | b0 | c0 | |
|---|---|---|---|---|---|---|---|---|
| 0 | 0 | 0 | 0 | 0 | 0 | 0 | 0 | |
| 1 | 1 | 0 | 0 | 0 | 0 | 1 | 0 | a0↑;b0↑; |
| 2 | 1 | 1 | 0 | 1 | 0 | 0 | 0 | b1↑;w↑;b0↓; |
| 3 | 1 | 0 | 0 | 1 | 0 | 0 | 1 | b1↓;c0↑; |
| 4 | 1 | 0 | 1 | 1 | 1 | 0 | 1 | c1↑;a1↑; |
| 5 | 0 | 0 | 1 | 0 | 1 | 0 | 0 | a0↓;w↓;c0↓; |
| 0 | 0 | 0 | 0 | 0 | 0 | 0 | 0 | c1↓;a1↓; |
FIG. 6

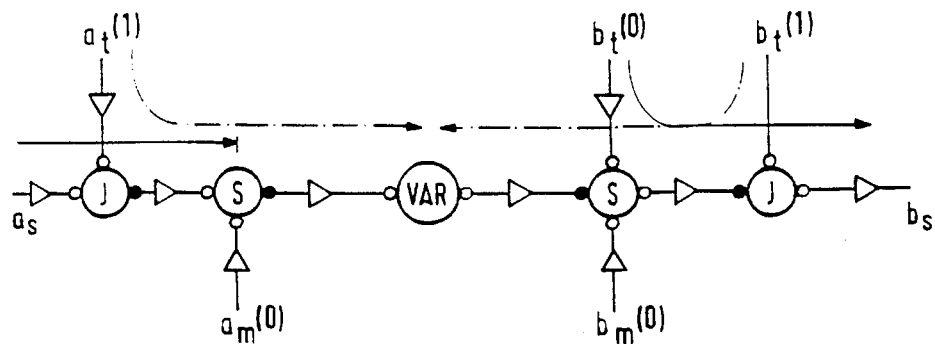
FIG.16
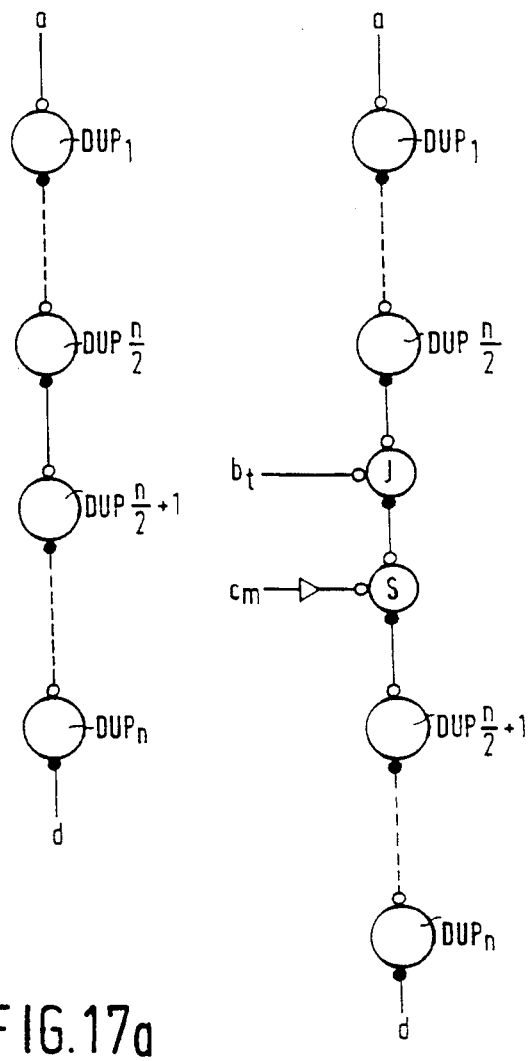
FIG.17a
FIG.17b 5,590,275

METHOD FOR TESTING AN INTEGRATED CIRCUITRY AND AN INTEGRATED CIRCUIT HAVING A PLURALITY OF FUNCTIONAL COMPONENTS AND HAVING JUNCTION/SWITCH TEST COMPONENTS IN INTERCONNECTING CHANNELS BETWEEN FUNCTIONAL COMPONENTS

This is a continuation of application Ser. No. 08/016,409, filed Feb. 11, 1993, now abandoned.

FIELD OF THE INVENTION

The invention relates to a method for testing electronic circuitry with a plurality of functional components interconnected by handshake channels. Testability of integrated circuits has been approached in various ways, inter alia as dependent on circuit technology, fault model, and test provisions that may be present or absent, physically as well as notionally. Earlier provisions include scan test or LSSD, boundary scan test, both of these approaching the circuit as a single black box. U.S. Pat. No. 4,656,592 to the same assignee teaches the breaking up of complicated circuits into partial circuits that maintain mutual synchronization through a handshaking procedure. This would allow for blockwise testing in a quite specific environment wherein the partial circuits operate synchronously and only the interaction between the various circuits is executed via handshakes. During development of the present invention it has occurred that widespread use of handshaking functional components is a preferred method to keep development of asynchronous circuitry manageable. Given such asynchronous realization, test generation remains a problem that more or less explodes exponentially with the size of the circuit, causing rather simple circuits to need an astronomical number of test patterns and/or test time. The present invention presents a solution in that it envisages breaking-into and breaking-out from the channels. In particular, a channel is herein understood to be a point-to-point connection that has an active port on its first end, and a passive port on its second end. The active/passive notion relates to activities on the communication protocol level, and not on the data transfer direction. This means that data may go from the passive port side to the active port side. By itself, no data transfer need even occur, if the only object of the communication is, e.g. synchronization.

SUMMARY TO THE INVENTION

Amongst other things, it is an object of the present invention to provide an infrastructure for structural testing of handshake circuits at a low level of organizational complexity. According to the present environment, a handshake circuit is a network of asynchronous circuit blocks that exhibit mutual synchronization and may exchange information.

According to one of its aspects, the invention provides a solution as a method for testing electronic circuitry having a plurality of functional components interconnected by handshake communication channels, each channel terminating at respective functional components. The termination being at an active port of a functional component from which a communication is initiated and a passive port of a functional component where such communication is awaited, respectively. The method provides one of the channels with an inbreaking junction thereby forming a first test component that at times other than testing the junction just forms part of the in-channel handshaking. The method includes breaking in via a passive port of the junction with a first test signalization which first test signalization is an alternative to any in-channel signalization towards the in-channel passive port of the junction. The first test signalization representing the test signalization for the channel in a test on any component with a passive port on the channel and any channel part between the any component and the test component. The design-for-testability may be embedded in a silicon compilation organization as per U.S. Pat. No. 5,005,136, issued Apr. 2, 1991, to the same assignee, which reference is referred to in particular for corresponding terminology. It has been found that inbreaking via a junction would even in the absence of any data transfer, by means of a synchronization signal returned, allow for executing a test. If the synchronization is not returned, this could signal a failed test. It should be noted that the present method need not necessarily have the sequence: provide test pattern, execute test, extract result pattern. Presentation of a test pattern may or may not result in a returned synchronization signal. A result pattern may emanate from executing a test by means of a test pattern that had been stored earlier. The test may be a self-test, wherein control is temporarily effected locally without external intervention.

More comprehensively, the invention provides a method for testing electronic circuitry having a plurality of functional components interconnected by handshake communication channels each terminating at respective functional components. The termination being at an active port of a functional component from which a communication is initiated and a passive port of a functional component where such communication is awaited, respectively. The method provides one or more of the channels with an inbreaking junction and/or one or more of the channels with an outbreaking switch thereby forming a set of test components that at times other than testing just form part of the in-channel handshaking. The method includes the step of breaking in via a passive port of a first channel's junction with a first test signalization. The first test signalization is an alternative to any in-channel signalization towards the in-channel passive port of the junction. Under control of an external control signal to a control port of a switch on a second channel, the method further includes breaking out from the second channel a second test signalization via an active extra-channel port of the switch. This breaking out of a second test signalization ceases any further in-channel signalization via an active further port of the second channel's switch, the first test signalization being the test signalization for the first channel in a test on any component with a passive port on the first channel and any channel part between such a component and the junction. The second test signalization being the test signalization for the second channel in a test on any component with an active port on the second channel, and any channel part between such components and the switch. Generally, a complicated circuit will need a plurality of junctions and a plurality of switches. In certain circumstances, one category of the two could be absent; like the junction, a switch could work in isolation: in case of a test, internal control could produce or not produce the result data at the switch's output.

The present invention makes the problem simpler by allowing it to be broken down into parts: insertion of such inbreaking and outbreaking facilities leads to a smaller depth of the state diagrams with respect to testing. It should be noted that both the first and the second test signalizations may comprise respective composite signals and/or multibit patterns, and moreover, neither of them need to contain data inasmuch as either one may comprise only communication primitive signals. It should be noted that U.S. Pat. No. 4,656,592 does not teach any specifics as to how the test would effectively be executed on the level of the synchronization primitives.

Advantageously, the method provides at least one channel with a switch that in its test signalization is controlled both in test mode for breaking out of in-channel signalizations within the at least one channel as well as in non-test mode for continuing in-channel signalizations. Under non-test situations this would allow for standard functionality. Advantageously, the method provides at least one channel with both a junction and a switch as a test component pair thereby allowing both inbreaking and outbreaking test facilities for the at least one channel. The contiguous junction and switch constitute a concrete or physical test component pair. By having the span of such concrete test component pairs overlapping each other, any part of the channel now covered by such overlapping is rendered testable. In particular, apart from wires, the channel may comprise such elements as buffers or invertors, that are now also rendered testable. The methodology deployed can be applied on various levels, such as on the board level, within a single chip, as well as on-chip between blocks of various levels of complexity. Moreover, it can be used as a partial approach, such as for specifically testing those parts of the circuits that are difficult to control or to observe otherwise.

Advantageously, the invention provides a method for executing a plurality of tests on respective functional components by presenting to the circuitry an aggregate test signal including aggregate control signals, extracting therefrom a first test signalization for inbreaking onto various junctions and also extracting respective external control signals for presentation to various switches and also extracting respective second test signalizations for breaking out from various switches. This allows for an external access either at a narrower path width or at a lower amount of data transfer. The organization for a proper ordering, extraction, aggregation of the various test and control signals may be obtained from the organizational structures that are available for handshake circuits, such as for (de)multiplexing, parallel composition, and sequential composition structures as disclosed in U.S. Pat. No. 5,005,136. Additionally, translating tables, hashing technology and signature generation could be used in various instances. The provision of various junctions and switches in the circuitry's communication channels is a direct hardware mirroring of the design for testability and the test method itself. Moreover, the provision of respective test components can be used in a self-test organization. Self-test is herein defined in that an aggregate test signal provided from outside is used in conjunction with various in-circuitry prepresented or prestored test signalizations, whether explicit or implicit, to execute a plurality of elementary test operations, after which a plurality of elementary test results are joined, signatured, or otherwise evaluated to signal an overall test evaluation outside the circuitry tested. By itself, such self-test principle with respect to a static RAM memory has been described in U.S. Pat. No. 5,325,367, EP published specification 350,538, to the assignee of the present application, herein incorporated by reference.

It is particularly advantageous of the invention, to test the electronic circuitry having a plurality of integrated circuits, by assigning to any channel crossing any border between separate integrated circuits a dummy functional component at the border for creating at either side of the border a separate channel as a respective one of the handshake channels. If the circuitry consists of more than one separate integrated circuit, it is not known in advance what the "neighbor" circuit would be. It could have the test provisions according to the invention, or not. And even in the positive case the two channels could have somewhat different protocols on a level that would interfere with the testing, although this would not be the case for standard handshaking. In particular, the latter provision would permit execution of a boundary or interconnection test, as an alternative approach to the boundary scan test standard according to JTAG, now IEEE 1149.1. On another level, the present invention can be used for test features according to self-test principles at various levels of complexity.

According to an advantageous aspect, an integrated handshake circuit testable according to the present invention, comprises a plurality of testable functional components that are interconnected by handshake communication channels each terminating at respective functional components. The termination being at an active communication initiating port of the functional component and a passive communication awaiting port of the functional component, respectively. Part of the channels being provided with an inbreaking junction or an outbreaking switch, thereby forming a set of test components that at times other than testing just form part of the in-channel handshaking. Any of the junctions having a first passive channel port for in-channel initiated communications and a second passive test port for externally initiated test communications, and a first active channel port for propagating both of the types of initiated communications. Any switch having a third passive channel port for in-channel initiated communications, a second active channel port for in-channel propagation of these initiated communications and in each one of at least part of the switches a combination of a third active test port for extra-channel propagation of these initiated communications and a fourth passive control port for selecting for propagation between the second active channel port and the third active test port. The circuit furthermore having a test control device for breaking in onto any second passive test port with the externally initiated test pattern. The testable components may be rendered testable, either directly by means internal thereto, or indirectly by testing the interconnection between those components and their environment. At other times than testing the test components just form part of the in-channel handshaking.

Advantageously, an integrated circuit wherein at least one channel comprises both a junction and a switch that together constitute a test component pair, thereby allowing both inbreaking and outbreaking test facilities for said at least one channel. Formation of test component pairs such as the above test component pairs raises the standard of testability.

In particular, the testable blocks or functional components are clockless on a granularity level of a channel handshake. This means that either the blocks are asynchronously operating, or their clocks have frequencies in a time-frame that is invisible on the level of the handshake. If their clocks are much faster, this boils down to operation in a time-discrete organization that is near-analog as seen from the handshake. If their clocks are much slower, the handshake sees the functional components as static.

Generally, the application of the invention reduces the test to a problem with a lower measure of complexity.

Advantageously, the circuit comprises a self-test device for receiving an external activation signal and having a developing device for developing from a provided aggregate test signal, including control signals, various elementary test signalizations and control signalizations for the junctions and switches, and for receiving and aggregating various elementary result signalizations to an aggregate result signal for inspection outside of the circuit. This allows for a much shorter total test time, in that, generally much less communication is required from the circuit under test to a test control and/or test evaluation machine. It should be noted again, that the switch control and the junction synchronization are directed towards the switch and junction, respectively. Switch synchronization emanates from the switch. The transfer direction of data, however, may be either way, in that both the switch and the junction may receive as well as transmit data on their extra-channel connections. Certain connections may be even bidirectional with respect to the data transferred.

Advantageously, a junction may have an electronic part in common with some channelwise contiguous functional component, and/or a switch may have an electronic part in common with some channelwise contiguous functional component. Such set-up would diminish the amount of extra hardware needed. Apart from such communality with a functional component, a contiguous junction/switch pair, in particular a concrete test component pair, may have certain electronic parts in common for thereby reducing hardware overhead.

Advantageously, the circuit according to the invention comprises an acknowledge device in at least one functional component for upon completion of a prespecified test thereon outputting an acknowledge signal extraneous to standard channel handshake signals from such functional component. Especially for a repeater functional element to be disclosed hereinafter, such signalization is a time-saving provision. The acknowledge may now be sent on the channels that are provided for the standard functions of the circuit.

Various advantageous aspects are recited in dependent claims.

DEFINITIONS

For purpose of illustration, the following definitions apply:

Handshake circuit: Graph, with channels as edges and handshake components as nodes, and with a provision for initialization.

Handshake component: Electronic circuit, that interacts with its environment by communicating along intermediary channels. Each communication is organized as a handshake. The initiative to communicate may vary per communication. To illustrate the invention, it suffices to fix initiatives per channel.

Channel: Bidirectional link of wires between a handshake component and its environment. To illustrate the invention, it suffices to regard channels as point-to-point connections, with unidirectional wires. The two terminals of a channel are called ports.

Port: Channel terminal in a handshake component. If the component initiates the communications along the channel, the port is called active. If its environment takes the initiative, the port is called passive.

Communication, or handshake: Finite sequence of communication events along a channel, organized as a handshake protocol, i.e. the initiative for the next event alternates between the communicating partners.

Communication event: Set of transitions along one or more of the wires of a channel, which set is provided with a completion criterion.

As reference model for the soundness and completeness of a test, we use the notion of test obligations. We assume that a correctness criterion for fabricated handshake circuits is available, and that the environment can detect whether or not the circuit halts in an initial state. Testing starts from initialized circuits. Theoretically, it may be impossible to drive a particular, faulty, circuit to its intended initial state, but the subsequent behavior of the circuit will then even more betray such faultiness. The possibility of faulty behavior that is not detected is ignored.

Test obligation: In time partially ordered set of communication events along the channels of the circuit, possibly with an initialization event at the end. Test obligations satisfy the constraint that a correct circuit responds to all events in the test obligation and terminates in an initial state.

Test: Set of test obligations, satisfying the two constraints that every test obligation is passed successively by a correct circuit, and that an incorrect circuit fails some test obligation, because it cannot respond to some event therein. This implies that by itself, a test is a complete set of stimuli and responses for attaining the object: to know whether of not the fabricated circuit is correct.

Test suite: Set of tests, representing various possibilities to test the circuit.

BRIEF DESCRIPTION OF THE FIGURES

The invention will be described in detail hereinafter, with respect to a preferred embodiment of which various aspects are shown in the appended Figures according to:

FIG. 4 has them interchanged according to the invention;

FIG. 5 shows an electronic circuit for a sequencer handshake component;

FIG. 6 lists the consecutive state combinations therein when operation in a correct environment;

FIG. 16 shows a full testability arrangement for the single-read, single-write variable;

FIG. 17a, b show a partial testability arrangement for a duplicator chain with an exponential reduction in the test time;

DESCRIPTION OF THE PREFERRED EMBODIMENTS

In the disclosure, for brevity, external test machinery, the application of test patterns and any register level implementation, and also any test evaluation are not treated in detail inasmuch as such is considered standard art; only the communication channels and their relation to the testability feature are fully explained, as well as certain electronic subcircuit components that are either feasible or accessory to such testing. Moreover, the disclosure does not go into the transistor level and only slightly into the gate level, inasmuch as these levels of realizing electronic circuitry are deemed common general knowledge.

BACKGROUND PHILOSOPHY

As for synchronous circuits, the problem of finding tests for arbitrary handshake circuits is a complicated problem: increasing the size of the problem (such as the number of channels) renders the number of solutions (e.g. patterns) exponentially larger. In the synchronous scan test approach, the solution reduces the test complexity by controlling and observing internal points during testing. This involves extra hardware per point, thus affecting the performance. Test costs and performance can be tuned by judiciously choosing the internal points. The resulting circuit has two modes of operation: a standard mode for the original behavior, and a test mode. The test approach for handshake circuits has some similarities.

Now, because the key to the testing of a handshake circuit is its communication behavior, controllability and observability relate to channels. Therefore, to test a handshake circuit independently from its environment, an extra interface for testing is created by inserting testability handshake components in the intermediary channels.

Figure 1:
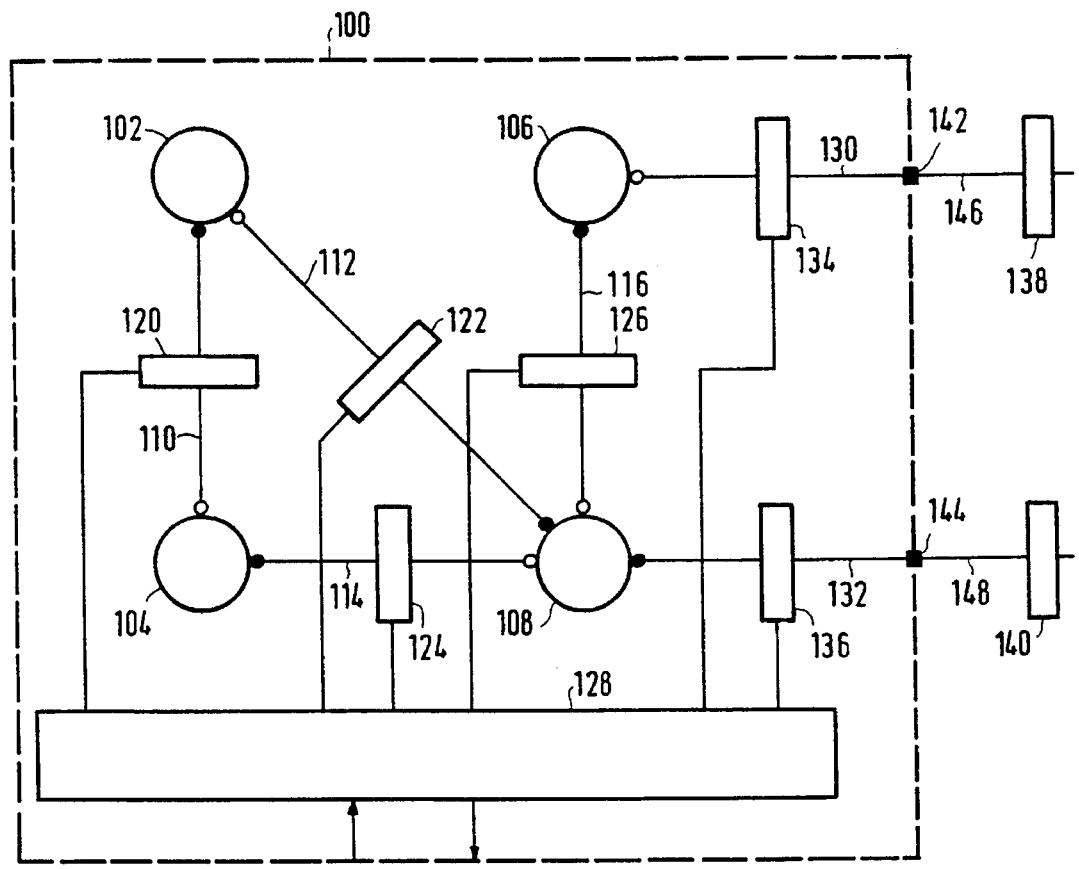
FIG. 1 shows a testable circuit according to the invention.

First, FIG. 1 shows a testable circuit according to the invention. The circuit 100 has four functional components 102 ... 108. For brevity the nature of their functionalities is not discussed as not relating to the invention proper. The functional components operate asynchronously and are interconnected by handshake channels 110 ... 116 that each have an inbreaking junction/outbreaking switch pair that will be discussed more in detail hereinafter. In certain situations, a channel may have only a single test component, either a junction or a switch as is explained hereinafter. In the Figure, the pairs are symbolized by blocks 120 ... 126 that communicate, bidirectionally if required, with test control block 128. Circuit 100 communicates for executing its standard functionality with external circuitry, not shown for brevity, along channels 130, 132. The border between circuit 100 and the external world is symbolized by dummy functional components 142, 144 that do not add further functionality. Now, channels 130, 132, between functional components 106, 108 and their counterpart dummy components have an inbreaking junction/outbreaking switch pair 134, 136 respectively. In the Figure, also external channels 146, 148 have their respective inbreaking junction/outbreaking switch pair 138, 140, that do not communicate with test control block 128. For brevity, their own test control block has not been shown. Test control block 128 receives from the external world (test machine) an aggregate test signal. This may imply test initialization, test patterns, intended result patterns, and any further control that is necessary. This control can direct which tests or partial tests should be executed and in what sequence, control the deriving of the test patterns from the overall test signal, the prescription for aggregating the result patterns to an overall result signal, preprocess control of the result patterns, such as comparing with an expected result, and various others.

Figure 2:
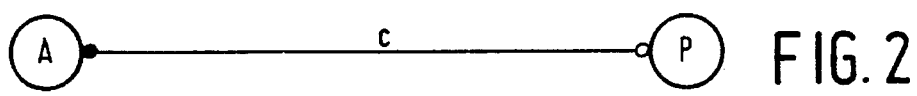
FIG. 2 shows two functional components interconnected by a channel.
Figure 3:
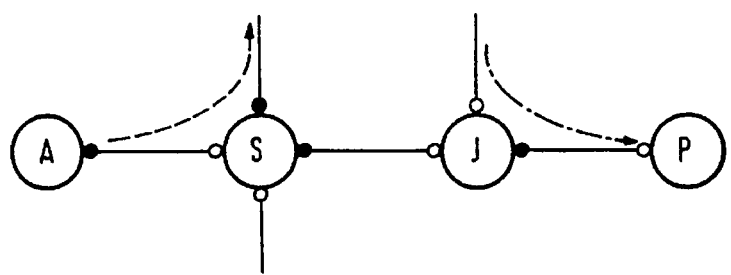
FIG. 3 shows addition thereto of a switch and a junction as two test components.

Now, FIG. 2 shows two circuits, A and P interconnected by a channel c. Circuit A is connected to the channel by its active port, shown by a solid dot, circuit P likewise by its passive port, shown by an open dot. Data, if any, may go from left to right or opposite. The active/passive ports undertake a handshake. Note that data may be physically on a separate wire (fibre, frequency, etcetera) parallel to the handshaking channel shown. Alternatively, data itself may carry the handshake protocol. The channel may be interior to one integrated circuit or interconnect two integrated circuits. Of course, any functional component may have an arbitrary number of ports. FIG. 3 shows the extra components S (switch) and J (junction) between handshake circuits A, P. Switch S is mode-controlled at its passive control input port external to the channel. Junction J does not need such control. In this set-up, communication actions initiated by circuit A and/or accepted by circuit P can be controlled and observed. Both controlling and observing are done through inbreaking on a first channel with first test signalizations on an inbreaking junction, and outbreaking at a second channel with second test signalizations at an outbreaking switch. Such observing and controlling however, by S has only an outbreaking functionality with respect to circuit A, whereas junction J may be omitted from the view-point of circuit A. Likewise, as seen from the view-point of circuit P, switch S may be omitted.

However, a test using the configuration as shown in FIG. 2, is not effective for the intermediate channel between switch S and junction J. Therefore, FIG. 4 has switch and junction interchanged. Combined they now constitute a test component pair that have their test objects overlapping, as regards channel part c. For a specific channel, the choice between both testability configurations is determined by the fault distribution of the manufacturing process, the desired fault coverage, and the associated ease of testing. In the following, we mainly concentrate on the configuration shown in FIG. 4. Now, the sequence of lines $c^a$, $c$, $c^p$ represents the original channel between the circuits A and P. In this channel, there is a junction 22 that has a passive test port in the channel, a passive test port external to the channel, and an active port in the channel. The communications on the two passive ports are passed through the single active port, and must not overlap. Furthermore, the channel has switch 24 that has a passive port in the channel, an external passive mode control port, an active port in the channel and a second active test port external to the channel. A handshake communication on the channel is passed through one of the two active ports as depending on the mode. In this way all parts of the channel $c^a$, $c$, $c^p$ are controllable and observable during testing. The junction allows for initiating communications (breaking in), the switch for intercepting communications (breaking out). If the test events on $c_t^a$ and on $c_t^p$ equal those on $c^a$ and $c^p$ respectively, then $c_t^a$ and $c_t^p$ have the same capabilities of controlling and observing the circuits A and P as $c^a$ and $c^p$ have. Often, weaker relations than equality between the in-channel communications and their test counterparts suffice to obtain these same capabilities.

About test generation, it is noted, that a test which is suitable for a basic component, will also test the same component in a configuration as shown in FIG. 4, provided that we replace the channel communications by their test-counterparts and that we set the corresponding switches in test mode before starting. In a configuration like FIG. 4, part of this test concerns signals that pass through switches forming part of the environment. These latter switches are therefore controlled in standard mode. This procedure may be refined to apply to the more elementary level of test obligations.

Now, abstracting from the testing of the testability components themselves, the above test procedure easily extends to handshake circuits in general by successively applying it to all basic components in the circuit. In fact, any composition of the local test procedures will do, as long as conflicting modes or communications do not occur simultaneously.

During the test, the testability components alternate between test and standard mode. It is possible to design them in such a way that their role in the testing of handshake circuits is self-diagnostic: through testing the original circuit, the entire organization for testability enhancement is tested automatically.

FIG. 5 shows an electronic circuit for a sequencer handshake component, cf. the referenced U.S. Pat. No. 5,005,136. It executes the bare handshakes along three channels $a(a0,a1)$, $b(b0,b1)$ and $c(c0,c1)$ that each consist of two physically unidirectional wires as shown. Internally, there are two AND gates 28, 30, each having one inverted input as indicated by an open circle. Finally, a so-called Muller C-element 32 is present. Such element has an output that has been shown twice (w) in the Figure and can have any number of inputs. Its output changes only if all inputs have the opposite value of the current output value; otherwise the output remains unchanged. FIG. 6 lists the consecutive stable state combinations when operating in a correct environment: when activated along channel a, it communicates once along channel b0, and subsequently, once along channel c0, respectively.

Figure 7:
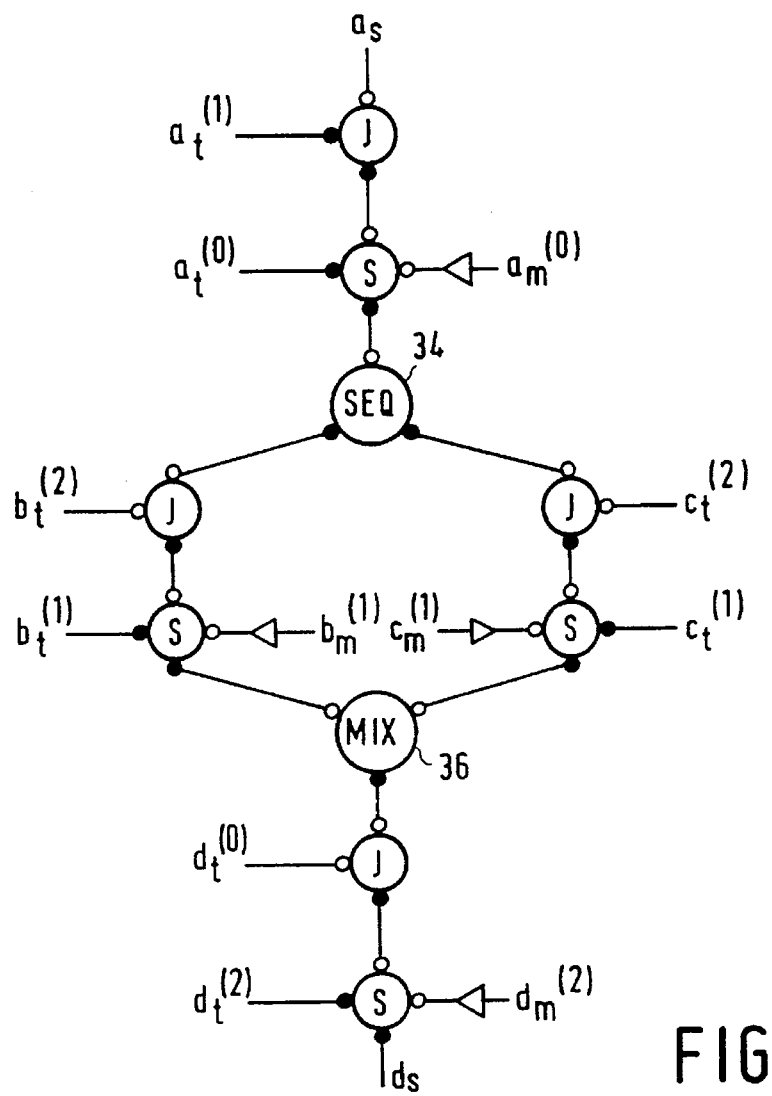
FIG. 7 shows a full testability arrangement of a slightly more complicated circuit operating as a duplicator.

FIG. 7 shows a full arrangement of test provisions for a slightly more complicated circuit. Shown are a sequencer 34 that would correspond to the arrangement of FIG. 5, and a mixer 36 that unconditionally directs any communication initiated on either passive port to its sole active port. This Figure illustrates that testability enhancement according to the invention considerably increases the number of external channels. This may be a problem for integrated circuits, with only a couple of dozens external channels. Partial integration of the test procedure can reduce the number of additional external channels to only a few, at the price of extra hardware. Like the testability components, this hardware can have a self-diagnostic role in the testing of the handshake circuit. Complete integration of the test procedures gives the synchronous equivalence of a circuit with a built-in self test, where only the external channels at the boundary of the circuit remain to be tested separately. The possibility to have a separate boundary test eases the testing of the interface between the circuit and its environment.

Figure 8:
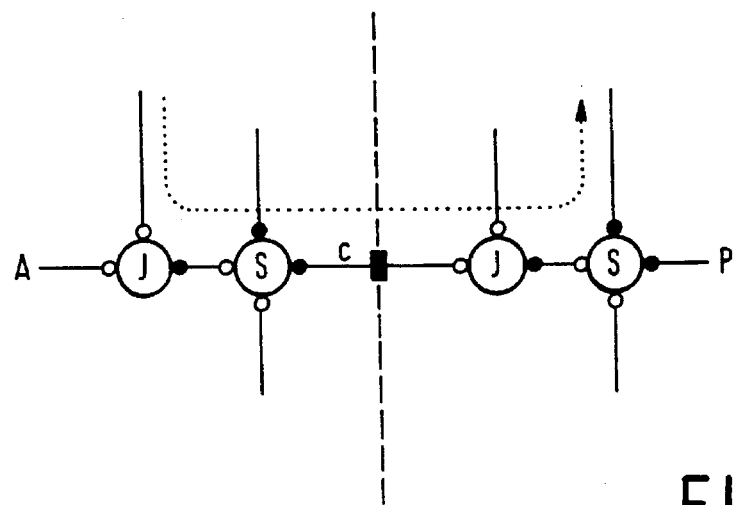
FIG. 8 shows a configuration of testability components suited for boundary or interconnection testing.

FIG. 8 gives a possible configuration of junctions and switches along an interconnection channel c between two integrated circuits A and P, for example along channel 130/146 in FIG. 1. The path taken during the interconnection test is indicated by the dotted line. Apart from interconnection channel c, no further parts of the two circuits are involved.

In design for testability, test and performance costs can be tuned by taking larger or smaller structures of handshake components as the basic components. Generally, such basic component is a cluster of electronic circuitry not having the provisions of FIG. 4, supra.

Within the scope of the invention, there are many alternative solutions on the above theme of circuit accommodations for testing. It is often advantageous to use composite structures that combine original handshake components and inbreaking/outbreaking components: the resulting circuit will be smaller and faster than the juxtaposed constituents because intermediate channels are superfluous. Also, combinations with test procedures or elements thereof may significantly reduce the test problem.

PRELIMINARIES TO A PREFERRED EMBODIMENT

Initializing a handshake circuit corresponds to making all external input wires low and waiting a certain amount of time for the circuit to settle in a stable state that is an initial state for a correctly functioning circuit. The settling time can be calculated from the circuit. So, the environment knows that the circuit is nominally in an initial state when all the external wires stay low for at least as long as the settling time.

Figure 9A:
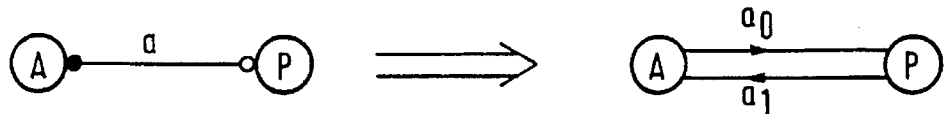
FIGS. 9a–c show various handshake channel organizations.
Figure 9B:
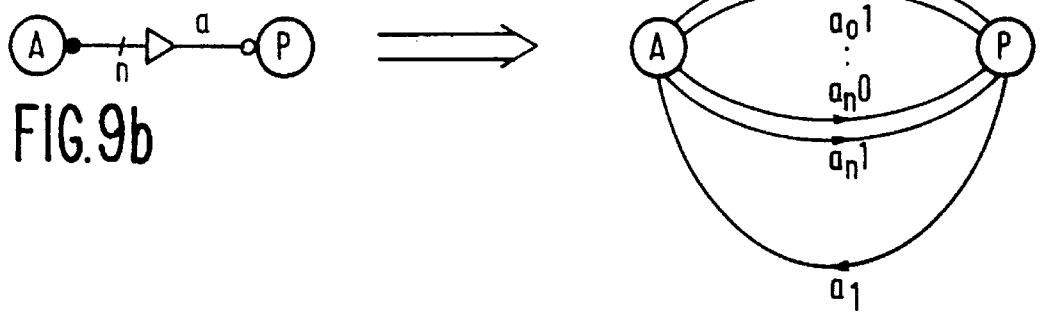
Figure 9C:
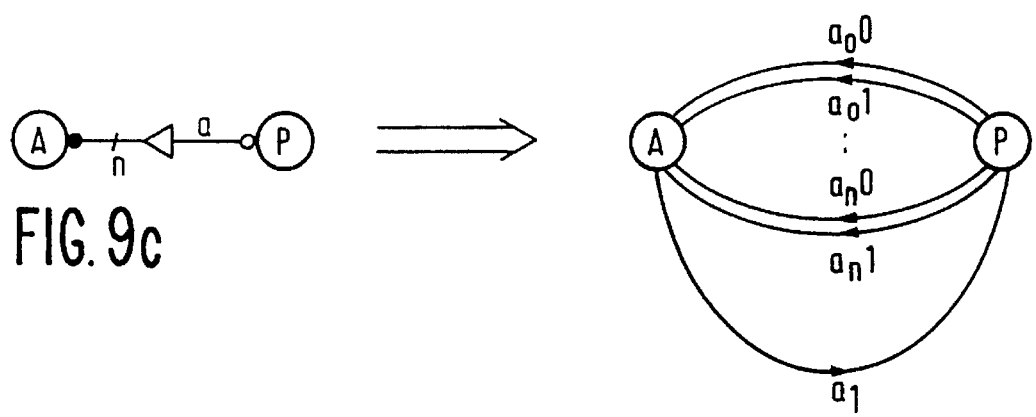

Channels are point-to-point connections, with unidirectional wires. The initiative to communicate is fixed per channel. A synchronization channel a has two wires: $a_0$ from the active port to the passive port, and $a_1$ from the passive port to the active port. A data channel has a single synchronization wire, on which data is requested or acknowledged, and a set of wires on which data is communicated. Data communications are unidirectional and in dual rail encoding, i.e. there are two wires per bit b, b0 for -zero-value, and b1 for -one- value, respectively. The schemes for the channel implementations are given in FIGS. 9a–c.

The following communication events are distinguished:
set synchronization wire w: $w\uparrow$
reset synchronization wire w: $w\downarrow$
set data d: b0 $\uparrow$ or b1 $\uparrow$ for all data bits b in the set of data wires d; shorthand notation: $d\uparrow$, or $d\uparrow v$ if v is the data value concerned
reset data: b0 $\downarrow$ or b1 $\downarrow$ for all data bits b in the set of data wires d; shorthand notation: $d\downarrow$, or $d\downarrow v$ if v is the original data value concerned The corresponding completion criteria are as expected:
$w\uparrow$ is complete when w=1
$w\downarrow$ is complete when w=0
$d\uparrow$ ($d\uparrow v$) is complete when b0=1 or b1=1, but not both equal to 1, for all data bits b in d
$d\downarrow$ ($d\downarrow v$) is complete when b0=1 and b1=1, for all data bits b in d A communication is organized as a 4-phase handshake, during which data and synchronization wires are set and reset, respectively:
$a_0\uparrow$; $a_1\uparrow$; $a_0\downarrow$; $a_1\downarrow$ Herein, a semicolon ';' indicates sequential ordering between signals prespecified and post-specified thereto, respectively. Furthermore, if a is a data channel, then either $a_0$ is the synchronization wire and $a_1$ is the collection of data wires, or vice versa (cf. FIG. 9).

The following programming constructs are used to specify the behavior at the ports of a handshake circuit in terms of the above events. Let E range over arithmetic expressions, and a over port names. We use superscripts to indicate that the initiative for a sequence of events at a port is internal (.*=active) or external (.°=passive):

a↑° is a shorthand notation for $a_0$ ↑; $a_1$ ↑, and a↓° for $a_0$ ↓; $a_1$ ↓, where the initiative is with the environment. Likewise for a↑°?x, a↓°?x, a↑°!E, and a↓°!E.

a↑• is a shorthand notation for $a_0$↑; $a_1$↑, and a↓• for $a_0$↓; $a_1$↓, where the initiative is internal. Likewise for a↑•?x a↓•?x, a↑•!E, and a↓•!E.

There are several ways to compose existing behaviors $P_0$ and $P_1$. Here, we use the operators (in decreasing order of priority) '*', ':', ';', '|', '□' '||', as defined below. As usual, bracket pairs '(.)' and '[.]' are used to escape from priorities and to clarify the syntactic structure.

Sequential composition $P_0$; $P_1$: first $P_0$, and then $P_1$.

a° is a shorthand for a↑°;a↓°, and a°?x for a↑°?x;a↓°?x. Likewise for a°?x, a°!E, a•, a•?x and a•!E.

Infinite repetition *$P_0$: infinitely often $P_0$

Parallel composition $P_0$||$P_1$ meaning $P_0$ and $P_1$ in parallel a↑°: $P_0$ denotes $a_0$↑; $P_0$; $a_1$↑, and a↓°: $P_0$ denotes $a_0$↓; $P_0$; $a_1$↓, where the initiative for a is external.

a↑•: $P_0$ denotes $a_0$↑; ($P_0$||$a_1$↑), where the initiative for a is internal.

External nondeterminism $P_0|P_1$: either $P_0$ or $P_1$, as chosen by the environment.

Internal nondeterminism $E_0 \rightarrow P_0 \square E_1 \rightarrow P_1$: either $P_0$ or $P_1$, depending on the validity of the corresponding boolean expressions $E_0$ and $E_1$.

An internal variable x of type T is declared as x: var T. Variable declarations are separated by '&' symbols. A passive port a for data of type T is declared as a°?T for inputs, and as a°!T for outputs. An active port a for data of type T is declared as a•?T for inputs, and as a•!T for outputs. A port a for synchronizations only is declared as a° for passive a, and as a• if a is active. Port declarations are separated by ',' symbols. Program constructs for the basic handshake components are of the form:

(port declarations). ⟦variable declarations|$P_0$⟧ or, without internal variable declarations:

(port declarations). $P_0$

SOME EXAMPLES OF HANDSHAKE COMPONENTS

Figure 10A:
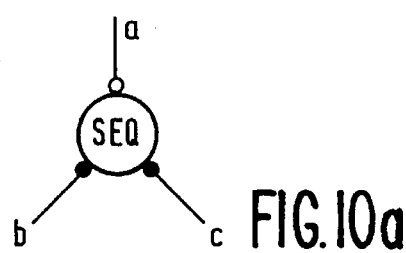
FIGS. 10a–d give four basic handshake components as embodiments.

FIGS. 10a .. d give the icons for four basic handshake components: a sequencer (a), a multiplexer (b), a repeater (c), and a variable (d).

Sequencer SEQ(a°, b•,c•) in FIG. 10a when activated along a subsequently communicates along b and c, respectively. The specification in terms of communication events is:

SEQ. (a°,b•, c•)=(a°, b•, c•).*[a↑°: (b•;c↑•) ;a↓°:c↓•]

Figure 10B:
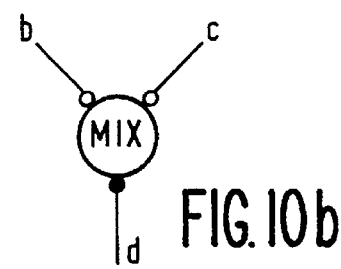

Multiplexer MIX. (b°, c°, d•) in FIG. 10b passes the communications along both b and c to d:

MIX. (b°,c°,d•) =
(b°,c°,d°) . *[b↑°:d↑•; b↓°:d↓•
| c↑°:d↑•; c↓°:d↓•
]

Figure 10C:
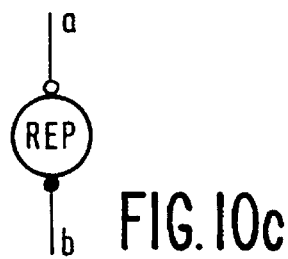

Repeater REP.(a°,b•) in FIG. 10c repeatedly communicates along b, once it is activated along a:

REP.(a°,b•)=(a°,b•).a↑°:*[b•]

Figure 10D:

Single-read, single-write, 1-bit variable $VAR_{(1,1)}.(a°,b°)$ in FIG. 10d, stores the last bit value input along a and sends it on request along b:

$VAR_{(1,1)}$ . (a°,b°) =
(a°!1, b°?1)
⟦x: var 1
| *[a°?x | b°!x]
⟧

Figure 11:
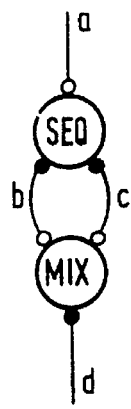
FIG. 11 combines two such components to a duplicator.

FIG. 11 combines a sequencer and a multiplexer to a duplicator. For each communication along a, it initiates two communications along d.

SELECTED TEST MODEL

As for synchronous circuits, the correctness criterion for fabricated circuits is based on a fault model. In the fault models for handshake circuits, faults are related to erroneous communications, such as the inability to transmit certain values or to complete a communication (deadlock). In the following we concentrate on deadlocks. For a 4-phase handshake with dual rail data transmission, a deadlock corresponds to the inability to set or reset some channel wire. Deadlocks also cover faults in internal wires which can be illustrated at the hand of FIG. 5. The intended behavior is:

*[$a_0$↑°; $b_0$↑•; $b_1$↑°; w↑; $b_0$↓•; $b_1$↓°; $c_0$↑•; $c_1$↑°; $a_1$↑•; $a_0$↓°; w↓;
$c_0$↓•; $c_1$↓°; $a_1$↓•] cf. SEQ (a°,b•,c•).

Both the setting and the resetting of internal channel w are followed by some external event: w ↑ by $b_0$↓, and w ↓ by $c_0$↓. If either of the internal events is disabled, e.g. as a result of a stuck-at fault on w, then so is the external event $a_1$↓, thus causing a deadlock on channel a.

Figure 12:
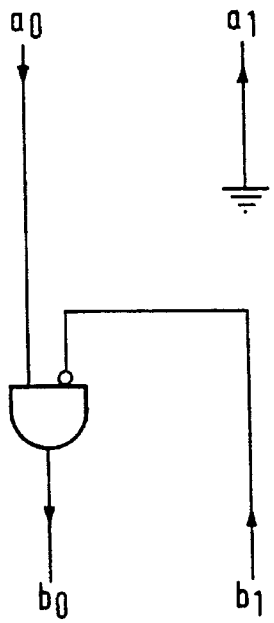
FIG. 12 shows an electronic circuit for a repeater handshake component.

FIG. 12 shows a concrete circuit for the basic component REP.(a°,b•), also from U.S. Pat. No. 5,005,136. It illustrates what was already expressed earlier: the absence of event $a_1$↑, and the necessity of initialization to end the computation and to test $a_0$↓.

Figure 13:
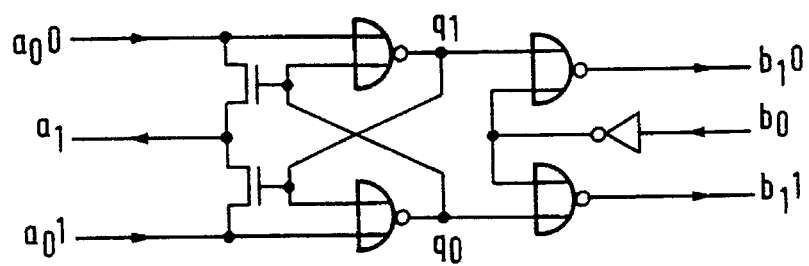
FIG. 13 shows an electronic circuit for a single-read, single-write variable handshake component.

FIG. 13 gives a concrete circuit for the basic component $VAR_{(1,1)}.(a°,b°)$, according to Netherlands Patent Application 9000544, corresponding U.S. Pat. No. 5,280,596, herein incorporated by reference. By storing the value 0 into the variable and then reading it, the wires $a_0$0, $a_1$, $b_0$ and $b_1$0 are tested for stuck-at-0/1 faults, wire q0 is tested for stuck-at-1, and q1 is tested for stuck-at-0. Storing the value 1 and then reading it, tests the wires $a_0$1, $b_1$1 for stuck-at-0/1 faults, q0 for stuck-at-0, and q1 for stuck-at-1. A complete test is thus obtained by executing both in sequence. As a result of the dual-rail encoding, it is not necessary to check the received value against the stored value. Given the above test model, the following tests are suited for testing the basic components in FIG. 10:

The test suite for SEQ.(a°,b•,c•) contains a single test with a single test obligation, specified by:

a↑•:(b°;c↑°); a↓•:c↓°

The test suite for MIX.(b°,c°,d•) contains a single test with two test obligations:

b↑•:d↑°; b↓•:d↓° and c•:d↑°; c↓•,d↓°

The test suite for REP.(a°,b•) contains an infinite number of singleton tests, such as $test_n$ with n>0 complete communications along b.

test$_n$=a↑•:(b°)$^n$; initialize

The test suite for a variable contains a single test with two test obligations:

a•!0; b•?y and a•!1; b•?y

Where convenient, we henceforth define a singleton test by giving its single element.

TESTABILITY ENHANCEMENT

Figure 14:
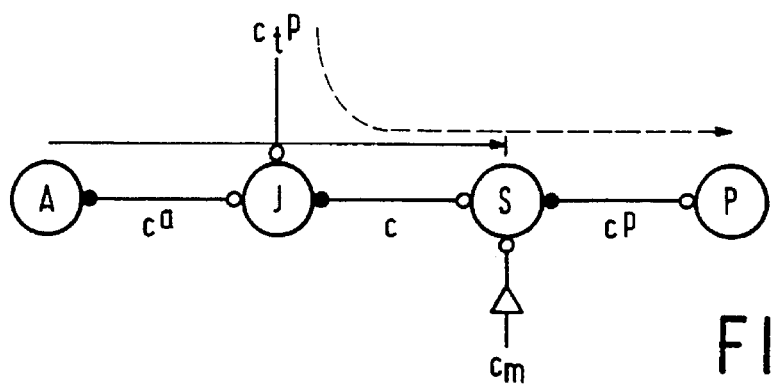
FIG. 14 shows an optimized version of FIG. 4 for use in a preferred embodiment.

For circuits with dual rail data encoding it suffices to test the setting and resetting of data outputs, unlike circuits with single rail data encoding, where the values are important as well. Also for synchronizations per se, it is sufficient to test for setting and resetting of synchronization wires. The test interfaces for the inbreaking and outbreaking components can therefore be simpler than the standard interfaces (cf. FIG. 14 as an optimized version of FIG. 4). Herein, the uninterrupted arrow delimits the test trajectory for component A, the interrupted arrow delimits the test trajectory for component P.

Breaking into a synchronization channel is done with the following type of junction:

JUNCTION$_{(-,-)}$.(p$_s$°, p$_t$°, p•) =
(p$_s$°,p$_t$°,p•) .
*[p$_s$↑°:p↑•; p$_s$↓°p↓•
|p$_t$↑°:p↑•; p$_t$↓°:p↓•
]

Note that the multiplexer MIX.(p$_s$°,p$_t$°,p•) matches this specification. Junctions for breaking into data input channels with W bits are specified by:

JUNCTION$_{(?,W)}$.(p$_s$°, p$_t$°, p•) =
(p$_s$°?W,p$_t$°?W,p•!W) .
‖x: var W
| *[p$_s$↑°?x: p↑•!x; p$_s$↓°?x: p↓•!x
|p$_t$↑°?x: p↑•!x; p$_t$↓°?x: p↓•!x
]
]

Junctions for breaking into data output channels with W bits, JUNCTION$_{(!,W)}$. (p$_s$°,p$_t$°,p•), are specified by:

JUNCTION$_{(!,W)}$ . (p$_s$°, p$_t$°, p•) =
(p$_s$°!W,p$_t$°, p•?W) .
‖x: var W
| *[p$_s$↑°!x : p↑•?x; p$_s$↓°!x : p↓•?x
|p$_t$↑°: p↑•?x ; p$_t$↓°:p↓•?x
]
]

The mode of operation in the outbreaking components is controlled by a boolean port a$_m$ and an internal boolean variable t: false for standard mode, and true for non-standard or test mode. The switches for breaking out of synchronization channels are specified by:

SWITCH$_{(-,-)}$.(a$_s$•, a$_t$• a$_m$°, a°) =
(a$_s$•, a$_t$•, a$_m$°? bool, a°)
‖t: var bool
| * [a$_m$°?t
|a↑°:[ ¬t→a$_s$↑• □ t→skip];
|a ↓°:[ ¬t→a$_s$↓• □ t→skip]
]
]

Switches for breaking out of input channels with W bits are specified by:

SWITCH$_{(?,W)}$.(a$_s$•, a$_t$•, a$_m$°, a°) =
(a$_s$•?W,a$_t$•? W,a$_m$° ? bool, a°!W).
‖t: var bool
& x: var W
| *[a$_m$°?t
|a↑°!X:[ ¬t→a$_s$↑•?X□t→a$_t$↑•?X];
|a↓°!X:[ ¬t→a$_s$↓•?X□t→a$_t$↓•?]
]
]

Switches for breaking out of data output channels with W bits are specified by

SWITCH$_{(!,W)}$.(a$_s$•,a$_m$°,a°) =
(a$_s$•? W,a$_t$• ? W,a$_m$°?bool,a°?W).
‖t: var bool
& x: var W
| *[a$_m$°?t
|a↑°!x:[ ¬t→a$_s$↑•!W□t→skip];
|a↓°!x:[ ¬t→a$_s$↓•!W□t→skip]
]
]

Figure 15:
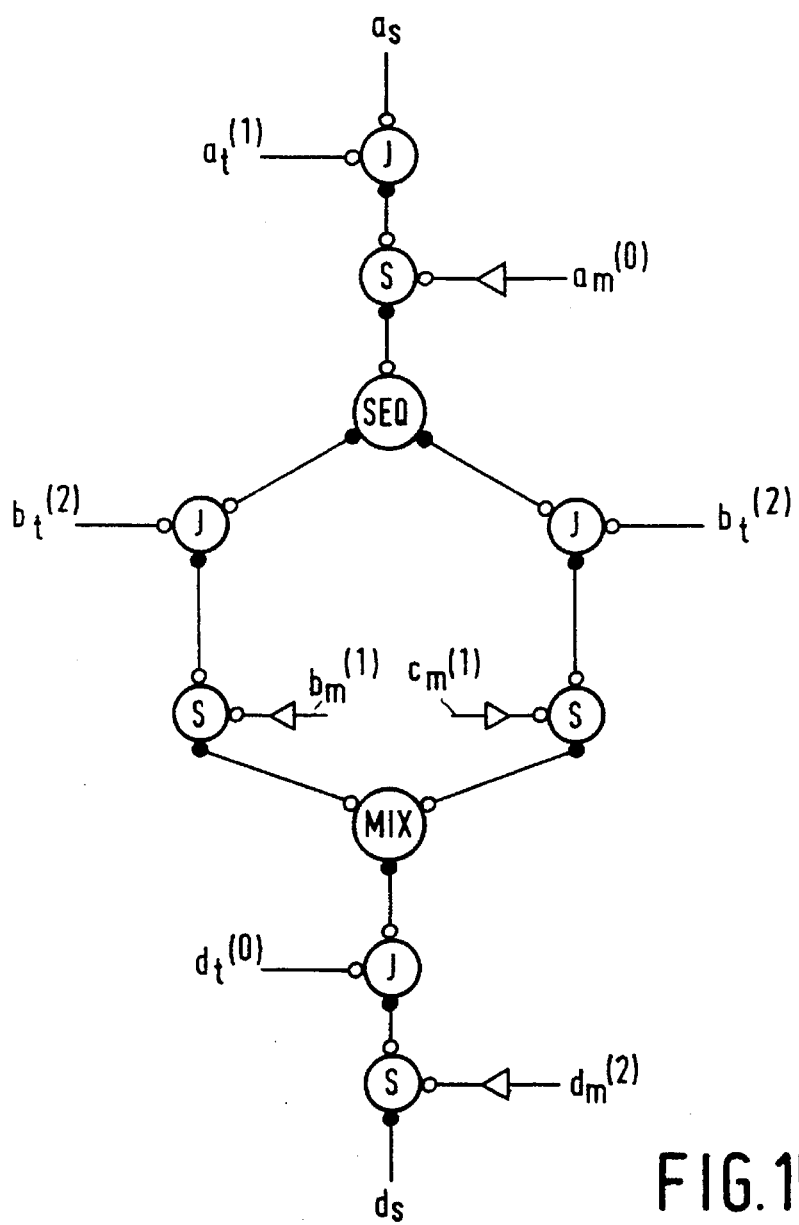
FIG. 15 likewise shows an optimized version of FIG. 7.

FIG. 15 gives the counterpart of FIG. 7 for the basic components SEQ.(a°,b•, c•) and MIX.(b°,c°,d•), in their combination as duplication. The ports with index 0 are part of the test interface of the environment, the ports with index 1 form the test interface of SEQ.(a°,b•,c•), and those with index 2 form the test interface of MIX.(b°,c°,d•).

FIG. 16 gives the corresponding counterpart to VAR$_{(1,1)}$.(a°,b°), with junctions and switches for data.

TEST GENERATION

A possible test counterpart of SEQ. (a°,b•,c•) in the configuration of FIG. 15 is:

(a$_m$$^{(0)}$•!false‖b$_m$$^{(1)}$•!true‖c$_m$$^{(1)}$•!true); a$_t$$^{(1)}$•

A possible test counterpart of MIX. (b°, c°, d•) in the configuration of FIG. 15 is:

(b$_m$$^{(1)}$•!false‖c$_m$$^{(1)}$•!false‖d$_m$$^{(2)}$•!true); b$_t$$^{(2)}$•; c$_t$$^{(2)}$•

A test for the complete duplicator of FIG. 15 includes the testing of the boundary, i.e. channels a$_s$ and d$_s$. A possible boundary test is:

(a$_m$$^{(0)}$•!true‖d$_m$$^{(2)}$•!false); (a$_s$•‖(d$_t$$^{(0)}$↑•: d$_s$↑°; d$_t$↓•:d$_s$↓°))

There are several possibilities to combine these to a test for the complete duplicator.

An example where the components are successively tested is:

(a$_m$$^{(0)}$•!false ‖ b$_m$$^{(1)}$•!true ‖ c$_m$$^{(1)}$•!true); a$_t$$^{(1)}$• ;

(b$_m$$^{(1)}$•!false ‖ c$_m$$^{(1)}$•!false ‖ d$_m$$^{(2)}$•!true); b$_t$$^{(2)}$• ; c$_t$$^{(2)}$• ;

(a$_m$$^{(0)}$•!true ‖ d$_m$$^{(2)}$•!false) ;(a$_s$• ‖(d$_t$$^{(0)}$↑• : d$_s$↑° ; d$_t$$^{(0)}$↓• : d$_s$↓°))

An example where the tests are interleaved is:

(b$_m$$^{(1)}$•!false ‖ c$_m$$^{(1)}$•!true ‖ d$_m$$^{(2)}$•!true); b$_t$$^{(2)}$• ;

-continued $(a_m^{(0)\bullet}!false \parallel b_m^{(1)\bullet}!true) ; a_t^{(1)\bullet} ;$ $c_m^{(1)\bullet}!false ; c_t^{(2)\bullet} ;$ $(a_m^{(0)\bullet}!true \parallel d_m^{(2)\bullet}!false); (a_s^{\bullet} \parallel (d_t^{(0)}\uparrow^{\bullet} : d_s\uparrow^{\circ} ; d_t^{(0)}\downarrow^{\bullet}: d_s\downarrow^{\circ}))$ Note that the behavior of all the junctions during these tests covers the test obligations as given for MIX.(.°, .°, .*): the junctions play a self-diagnostic role. This is also true for the switches.

Testing a handshake component with data in an equally enhanced configuration is similar. A test for the basic handshake component $VAR_{(1,1)}.(a°, b°)$ in FIG. 16 is for example:

$a_m^{(0)}!false \| b_m^{(0)}!false); a_t^{(1)\bullet}!0; b_t^{(1)\bullet}; a_t^{(0)\bullet}!1; b_t^{(1)\bullet}$

VARIOUS OPTIMIZATIONS

That test application and performance costs can be tuned by judiciously choosing the internal points for testability enhancement, which is illustrated using FIGS. 17a, b. Without testability enhancement, as in FIG. 17a, the number of test events in this chain of n duplicators is $0(2^{n+1})$. Insertion of testability provisions half-way down the chain, as in FIG. 17b, gives a significant exponential reduction to $$2^{\frac{n+1}{2}}$$

test events.

Figure 18A:
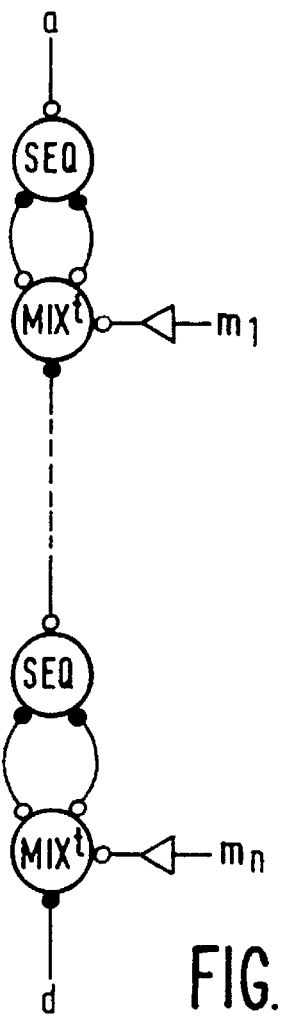
FIGS. 18a–c show a slightly different implementation of a duplicator chain with a linear test time.
Figure 18B:
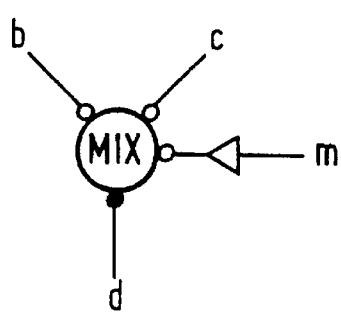
Figure 18C:
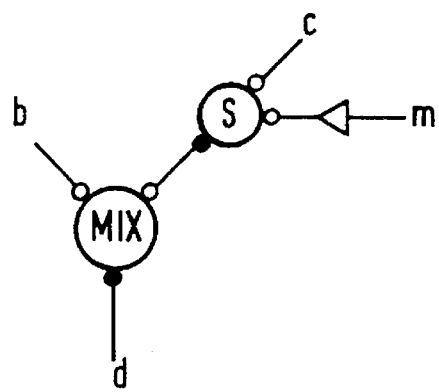

Another solution is shown in FIG. 18a, where a new basic component MIX'. (m°, b°, c°, d*) has been substituted for MIX. (b°, c°, d*). The new component is a composition of the original one with a switch for breaking out of channel c (cf. FIG. 18b). Its behavior is as follows:

```
MIX^t(m°, b°, c°, d*) =
(m°?bool, b°, c°, d*).
[[t : var bool
| *[m°?t
    |b↑° : d↑* ; b↓° : d↑*
    |c↑° : [ ¬t→d↑* □ t → skip]
     c↓° : [ ¬t→d↓* □ t → skip]
    ]
]]
```

A possible test for MIX'. (m°, b°, c°, d*) that links up nicely with the SEQ. (a°, b*, c*)—components in the duplicator is:

m*!true; b↑*: d↑°; b↓*: d↓°; c*; m*!false

This validates the following test for the complete chain in FIG. 18a:

$(m_1^*!true\| \ldots \|m_n^*!true) \ a\uparrow^*:d°;a\downarrow^*; (m_1^*!false \| \ldots \|m_n^*!false)$ The corresponding number of test events is O(n).

Because the test language is similar to the programming language, an automatic (partial) integration of the test can be facilitated by the compiler. If, for example, the parts $(m_1^*!true\| \ldots \|m_n^*!true).(m_1^*!false\| \ldots \|m_n^*!false)$ are built-in, the number of additional external channels is reduced to 2: m and s. The circuit test reduces to:

$(s^*\|m^*!true; a\uparrow^*:d°; a\downarrow^*; (s^*\|m^*!false)$

A considerable amount of circuitry is added, however.

Figure 19:
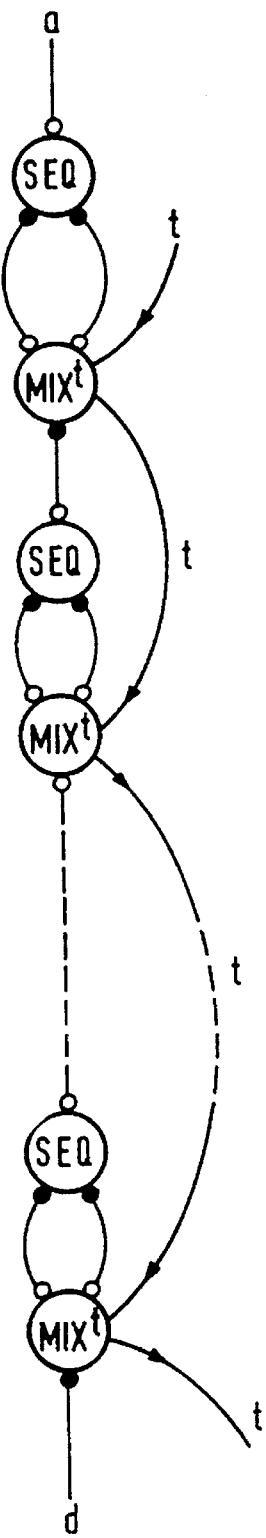
FIG. 19 shows an efficient implementation for the mode of operation as exemplified by the multiplexer handshake component MIX.

An alternative solution, with the same advantages, but without the overhead in circuitry, is to use a single wire to set the circuit in the appropriate mode of operation (cf. FIG. 19). This wire, here referred to as t, is both an external input and an external output of the circuit, and is routed through all the basic components having a test mode. This can be done such that, in all handshake components with a test mode, the events at the output side of t serve as acknowledgement of the events at the input side of t: after the events at the input side of t become observable at the output side of t, the rest of the circuit is set in the appropriate mode before a fixed amount of time has passed.

As for initialization, the amount of time to settle can be calculated from the circuit. Thus, t can be conceived as a channel with two wires. Here, we take a two-phase handshake protocol to communicate along t, where t=1 represents the test mode and t=0 the standard mode of operation. The components with a test mode, i.e. where the behavior under test is different from the standard behavior, are slightly changed. A possible specification for $MIX^t.(t°, b°, c°, d*)$ is given below.

```
MIX^t.(t°, b°, c°, d*) =
(t°, b°, c°, d*)
*[ t↑°
 | t↓°
 |b↑°:d↑* ; b↓°:d↑*
 |c↑°:[t=0 →d↑* □ t=1 → skip]
  c↓°:[t=0 →d↓* □ t=1 → skip]
 ]
```

The test for the complete chain is now:

$t\uparrow^*; \ a\uparrow^*:d°; a\downarrow^*; t\downarrow^*.$

We claim:

1. A method for testing electronic circuitry having a plurality of functional components interconnected by primary handshake communication channels for communication of in-channel signalizations each primary handshake communication channel having a first terminating end and a second terminating end, each functional component having at least one of i) an active port and ii) a passive port, said first terminating end of each of said primary handshake communication channels terminating at an active port of one of said functional components which functional component active port initiates a communication and said second terminating end of each of said primary handshake communication channels terminating at a functional component passive port awaits the communication, said method comprising the steps of:

providing at least one of said primary handshake communication channels with an in-breaking junction which divides said at least one primary handshake communication channel into a string of secondary handshake communication channels which string serially couples the two functional components having the active and passive ports on said at least one primary handshake communication channel together forming a first test component for testing said at least one primary handshake communication channel and said functional components during a test mode, said junction having a passive port and an in-channel passive port and forming part of the handshake communication in said at least one primary handshake communication channel when not in said test mode; and breaking in via said passive port of said junction with a first test signalization, the first test signalization being an alternative to any of the in-channel communication directed towards said in-channel passive port of said junction, and wherein the first test signalization tests any component having a passive port on said at least one primary handshake communication channel and any channel part between said any component and said first test component.

2. A method as claimed in claim 1, wherein said electronic circuitry is a single integrated circuit, and the step of providing an in-breaking junction is performed on a primary handshake communication channel within the integrated circuit.

3. A method as claimed in claim 1, for testing said electronic circuitry having a plurality of integrated circuits, further including the step of assigning to any channel crossing any border between separate integrated circuits a dummy functional component while at either side of said border creating a separate channel as a respective one of said primary handshake communication channels.

4. A method as claimed in claim 3, further including the step of executing an interconnection test by means of inbreaking and outbreaking respective test signalizations on said respective separate channels pairwise joined by an associated said dummy functional component.

5. The method as claimed in claim 1, wherein the communication channels and functional components are coupled together along a path and wherein the step of breaking in with a first test signalization tests any channel in the path of the first test signalization.

6. An integrated circuit comprising a plurality of testable functional components each having at least one of an active communication initiating port and a passive communication awaiting port interconnected by primary handshake communication channels for communication of in-channel signalizations each primary handshake communication channel having a first terminating end terminating at an active communication initiating port and a second terminating end terminating at a passive communicating awaiting port of said functional components and at least one of said primary handshake communication channels being provided with at least one of i) an inbreaking junction and ii) an outbreaking switch, thereby forming at least one test component that at other times than testing just forms part of the in-channel handshaking and wherein the at least one test component divides said at least one primary handshake communication channel into a string of secondary handshake communication channels which string serially couples together the two functional components having the active and passive communication ports on said at least one primary handshake communication channel, any of said junctions having a passive channel port for in-channel initiated communications and a passive test port for externally initiated test communications, and a active channel port for propagating both said types of initiated communications, any said switch having a passive channel port for in-channel initiated communications, a active channel port for in-channel propagation of these initiated communications and an active test port for extra-channel propagation of these initiated communications and a passive control port for selecting for propagation between said active channel port and said active test port.

7. A circuit according to claim 6, wherein a single primary handshake communication channel includes both a junction and a switch that together constitute a test component pair, thereby allowing both inbreaking and outbreaking test facilities for said single primary handshake communication channel.

8. A circuit as claimed in claim 6, wherein a dummy functional component is assigned to a border of said integrated circuit which creates a further handshake communication channel terminating at said dummy functional component for attachment to a further integrated circuit and said further handshake communication channel being provided with a junction and a switch as a test component pair.

9. A circuit as claimed in claim 6, wherein said functional components are clockless on a granularity level of a channel handshake.

10. A circuit as claimed in claim 6, further including self-test means for receiving an external activation signal and an aggregate test signal including a control signal, said self-test means including developing means for developing from said aggregate test signal various elementary test signalizations and control signalizations for said junctions and switches and aggregating means for aggregating said externally initiated test signalizations and said second test signalizations to an aggregate result signal for inspection outside said circuit.

11. A circuit as claimed in claim 6, wherein said junction has an electronic part in common with one of said functional components at which a primary handshake communication channel terminates.

12. A circuit as claimed in claim 6, wherein said switch has an electronic part in common with one of said functional components at which a primary handshake communication channel terminates.

13. A circuit as claimed in claim 6, wherein one of said functional components includes acknowledge means for upon completion of said testing outputting an acknowledge signal extraneous to said in-channel signalizations occurring during non-test mode from one of said functional components.

14. A circuit as claimed in claim 6, further including a testable variable-presenting functional component.

15. A circuit as claimed in claim 6, wherein said electronic circuitry includes a multiplicity of interconnected integrated circuits.

16. A circuit as claimed in claim 6, wherein a single test channel serpentines through a plurality of junctions and switches for operating as a two-phase handshake channel.

17. A method of testing asynchronous solid-state electronic circuitry having a plurality of functional components interconnected by primary handshake communication channels for communication of in-channel signalizations, each primary handshake communication channel having a first terminating end and a second terminating end, each functional component having at least one of i) an active port and ii) a passive port, said first terminating end of each of said primary handshake communication channels terminating at an active port of one of said functional components which functional component active port initiates a communication and said second terminating end of each of said primary handshake communication channels terminating at a passive port of one of said functional components which functional component passive port awaits the communication, said method comprising the steps of:

providing a first primary handshake communication channel with an inbreaking junction which divides said first primary handshake communication channel into a string of secondary handshake communication channels which string serially couples the two functional components having the active and passive ports on said first primary handshake communication channel together and a second primary handshake communication channel with an outbreaking switch, which switch divides said second primary handshake communication channel into a string of secondary handshake communication components which string serially couples the two functional components having the active and passive ports on said second primary handshake communication channel together said junction and said switch forming a set of test components for testing said first and second primary handshake communication channels and said functional components positioned thereon during a test mode and forming part of the handshake communication in said first and second primary handshake communication channels when not in said test mode, said junction having a passive port and an in-channel passive port, said switch having a control port, an active extra-channel port and a further active port;

breaking in via said passive port of said junction with a first test signalization, the first test signalization being an alternative to any of the in-channel signalizations directed towards said in-channel passive port of said junction; and breaking out via said active extra-channel port of said switch a second test signalization under control of an external control signal at said control port of said switch, the second test signalization being an alternative to any further in-channel signalization via said further active port of said switch and wherein the first and second test signalizations test (a) any component with a passive port on said first primary handshake communication channel, (b) any component with an active port on said second primary handshake communication channel and, (c) any channel part between i) said in breaking junction and said any component with a passive port on said first primary handshake communication channel ii) any component with a passive port on said first primary handshake communication channel and any component with an active port on said second primary handshake communication channel and iii) any component with an active port on said second primary handshake communication channel and said outbreaking switch.

18. A method as claimed in claim 17, further including the step of providing at least one primary handshake communication channel with both a junction and a switch as a test component pair thereby allowing both inbreaking and outbreaking test facilities for said at least one primary handshake communication channel.

19. A method as claimed in claim 17, further including the steps of:

controlling said switch for breaking out the second test signalization during said test mode; and controlling said switch for propagating the in-channel signalization via said further active port of said switch when not in said test mode.

20. A method as claimed in claim 17, for executing a plurality of tests on said functional components and further including the steps of:

presenting an aggregate test signal to said circuitry including aggregate control signals;

extracting from the aggregate test signal the first test signalization; and extracting from the aggregate test signal control signals for controlling said switch.

21. A testing circuit for electronic circuitry having a plurality of testable functional components interconnected by primary handshake communication channels for communication of in-channel signalizations, wherein a first functional component includes an active port and a second functional component includes a passive port and wherein a primary handshake communication channel has a first terminating end terminating at an active port of a functional component and a second terminating end terminating at a passive port of a functional component, wherein said active port initiates a communication and said passive port awaits said communication, said testing circuit comprising:

an inbreaking junction provided on a first primary handshake communication channel which divides said first primary handshake communication channel into a string of secondary handshake communication channels which string serially couples the two functional components having the active and passive ports on said first primary handshake communication channel together for testing said primary handshake communication channel functional components during a test mode, said junction having a passive port for awaiting externally initiated test signalizations, an in-channel passive port for awaiting in-channel signalizations and an active port for propagating the in-channel signalizations such that during a non-test mode said junction forms part of the handshake communication in said first primary handshake communication channel, said passive port of said junction for awaiting communication of the externally initiated test signalization during the test mode, and said active port of said junction for propagating the externally initiated test signalization instead of the in-channel signalizations during the test mode; and an outbreaking switch provided on a second primary handshake communication channel which switch divides said second primary handshake communication channel into a string of secondary handshake communication channels, which string serially couples the two functional components having the active and passive ports on said second primary handshake communication channel together, said switch and junction forming a set of test components, said switch having an active extra channel port for breaking out of said second primary handshake communication channel a second test signalization, a further active port for propagating the in-channel signalization during a non-test mode and a control port for receiving control signalizations and for selecting between activating said active extra channel port and activating said further active port.

22. A circuit according to claim 21, wherein at least one of the first and second primary handshake communication channels includes both a junction and a switch that together constitute a test component pair, thereby allowing both inbreaking and outbreaking test facilities for said at least one primary handshake communication channel.

23. A circuit as claimed in claim 21, wherein a dummy functional component is assigned to a border of said integrated circuit which creates a further primary handshake communication channel terminating at said dummy functional component for attachment to a further integrated circuit and said further primary handshake communication channel being provided with a junction and a switch as a test component pair.

24. A circuit as claimed in claim 21, further including self-test means for receiving an external activation signal and an aggregate test signal including a control signal, said self-test means including developing means for developing from said aggregate test signal various elementary test signalizations and control signalizations for said junctions and switches, and aggregating means for aggregating said externally initiated test signalizations and said second test signalizations to an aggregate result signal for inspection outside said circuit.

25. A circuit as claimed in claim 21, wherein said junction includes an electronic part in common with one of said functional components.

26. A circuit as claimed in claim 21, wherein said switch includes an electronic part in common with one of said functional components.

27. A circuit as claimed in claim 21, wherein one of said first and second functional components includes acknowledge means for, upon completion of said testing, outputting an acknowledge signal extraneous to said in-channel signalizations occurring during non-test mode from one of said first and second functional components.

28. A circuit as claimed in claim 21, wherein said electronic circuitry includes a multiplicity of interconnected integrated circuits.

29. A circuit as claimed in claim 21, wherein a single primary handshake communication channel serpentines through a plurality of junctions and switches for operating as a two-phase primary handshake channel.

30. A method of testing electronic circuitry having a plurality of functional components interconnected by primary handshake communication channels for communication of in-channel signalizations, each primary handshake communication channel having a first terminating end and a second terminating end, each functional component having at least one of i) an active port and ii) a passive port, said first terminating end of each of said primary handshake communication channels terminating at an active port of one of said functional components which functional component active port initiates a communication and said second terminating end of each of said primary handshake communication channels terminating at a passive port of one of said functional components which functional component passive port awaits the communication, said method comprising the steps of:

providing a first primary handshake communication channel with an inbreaking junction and an outbreaking switch which divide said first primary handshake communication channel into a string of secondary handshake communication channels, which string serially couples the two functional components having the active and passive ports on said first primary handshake communication channel together, said junction and said switch forming a set of test components for testing said first primary handshake communication channel and said functional components coupled to said first primary handshake communication channel during a test model and wherein said junction and switch form part of the handshake communication in said first primary handshake communication channel when not in said test mode, said junction having a passive port and an in-channel passive port, said switch having a control port, an active extra-channel port and a further active port;

breaking in via said passive port of said junction with a first test signalization, the first test signalization being an alternative to any of the in-channel signalizations directed towards said in-channel passive port of said junction; and breaking out via said active extra-channel port of said switch a second test signalization under control of an external control signal at said control port of said switch, the second test signalization being an alternative to any further in-channel signalization via said further active port of said switch and wherein the first and second test signalizations test any component with a passive port on said first primary handshake communication channel, any component with an active port on said first primary handshake communication channel, and said first primary handshake communication channel.

31. A testing circuit for electronic circuitry having a plurality of testable functional components interconnected by primary handshake communication channels for communication of in-channel signalizations, wherein a first functional component includes an active port and a second functional component includes a passive port and a primary handshake communication channel has a first terminating end terminating at said active port and a second terminating end terminating at said passive port, wherein said active port initiates a communication and said passive port awaits said communication, said testing circuit comprising:

an inbreaking junction provided on said primary handshake communication channel for testing said primary handshake communication channel and said functional components during a test mode, said junction having a passive port for awaiting externally initiated test signalizations, an in-channel passive port for awaiting in-channel signalizations and an active port for propagating the in-channel signalizations such that during a non-test mode said junction forms part of the handshake communication in said primary handshake communication channel, said passive port of said junction for awaiting communication of the externally initiated test signalization during the test mode, and said active port of said junction for propagating the externally initiated test signalization instead of the in-channel signalizations during the test mode; and an outbreaking switch also provided on said primary handshake communication channel, said junction and said switch divide said primary handshake communication channel into a string of secondary handshake communication channels which string serially couples said first and second functional components together, said switch and junction forming a set of test components, said switch having an active extra channel port for breaking out of said primary handshake communication channel a second test signalization, a further active port for propagating the in-channel signalization during a non-test mode and a control port for receiving control signalizations and for selecting between activating said active extra channel port and activating said further active port.

\* \* \* \* \*